US009596791B2

(12) United States Patent
Sakuma et al.

(10) Patent No.: US 9,596,791 B2
(45) Date of Patent: Mar. 14, 2017

(54) COOLING DEVICE AND POWER CONVERTER HAVING COOLING DEVICE

(71) Applicant: FUJI ELECTRIC CO., LTD., Kawasaki-shi (JP)

(72) Inventors: Masaki Sakuma, Hino (JP); Masakazu Gekinozu, Matsumoto (JP); Yukihiro Nishikawa, Kodaira (JP); Yasuhito Tanaka, Yokosuka (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/680,501

(22) Filed: Apr. 7, 2015

(65) Prior Publication Data

US 2015/0216090 A1 Jul. 30, 2015

Related U.S. Application Data

(63) Continuation of application No. PCT/JP2014/000922, filed on Feb. 21, 2014.

(30) Foreign Application Priority Data

Mar. 19, 2013 (JP) ................................. 2013-056929

(51) Int. Cl.
*H05K 7/20* (2006.01)
(52) U.S. Cl.
CPC ......... *H05K 7/20927* (2013.01); *H05K 7/202* (2013.01); *H05K 7/20154* (2013.01); *H05K 7/20909* (2013.01); *H05K 7/20918* (2013.01)

(58) Field of Classification Search
None
See application file for complete search history.

(56) References Cited

U.S. PATENT DOCUMENTS

| 4,460,956 | A | 7/1984 | Hamasaki |
| 6,144,556 | A * | 11/2000 | Lanclos ............. H05K 7/20854 361/695 |
| 6,778,390 | B2 | 8/2004 | Michael |

(Continued)

FOREIGN PATENT DOCUMENTS

| JP | S53-60706 U | 5/1978 |
| JP | S57-201086 U | 12/1982 |

(Continued)

*Primary Examiner* — Courtney Smith
*Assistant Examiner* — Zhengfu Feng
(74) *Attorney, Agent, or Firm* — Rabin & Berdo, P.C.

(57) ABSTRACT

A cooling device includes a plurality of side wall fins formed on an outer surface of a first side wall of a housing, and a plurality of bottom fins formed on a bottom surface of a bottom portion of the housing. A cover member covers the side wall fins and bottom fins from an outer side to form side wall and bottom cooling channels. A chamber is provided that forms a fluid introduction chamber in a direction facing a second side wall so as to communicate with the side wall cooling channel and the bottom cooling channel. A coolant supply device is externally attached to the chamber so as to supply a coolant to the fluid introduction chamber. The side wall fins and the bottom fins are formed in predetermined shapes to adjust an amount of the coolant in the side wall cooling channel and the bottom cooling channel.

14 Claims, 10 Drawing Sheets

(56) References Cited

U.S. PATENT DOCUMENTS

| | | | | |
|---|---|---|---|---|
| 6,822,856 B2* | 11/2004 | Fujiwara | ............... | G06F 1/203 |
| | | | | 165/185 |
| 7,813,128 B2* | 10/2010 | Marchand | .......... | H05K 7/20909 |
| | | | | 361/694 |
| 8,320,127 B2* | 11/2012 | Leutwein | ........... | H05K 7/20909 |
| | | | | 165/185 |
| 8,741,466 B2* | 6/2014 | Youngs | ................... | B60K 6/28 |
| | | | | 165/80.3 |
| 2005/0029241 A1* | 2/2005 | Miao Spear | ......... | B23K 9/1006 |
| | | | | 219/130.1 |
| 2007/0034353 A1* | 2/2007 | Liu | ....................... | H01L 23/473 |
| | | | | 165/80.4 |
| 2009/0279251 A1* | 11/2009 | Liu | ................... | H05K 7/20336 |
| | | | | 361/690 |
| 2011/0108250 A1 | 5/2011 | Horng et al. | | |
| 2012/0049788 A1* | 3/2012 | Kim | ................. | H05K 7/20918 |
| | | | | 320/107 |
| 2012/0155015 A1* | 6/2012 | Govindasamy | ......... | G06F 1/203 |
| | | | | 361/679.46 |

FOREIGN PATENT DOCUMENTS

| | | |
|---|---|---|
| JP | S58-83196 U | 6/1983 |
| JP | S61-12290 U | 1/1986 |
| JP | S62-57295 A | 3/1987 |
| JP | 2002-314281 A | 10/2002 |
| JP | 2004-006558 A | 1/2004 |
| JP | 2007-329253 A | 12/2007 |
| JP | 2012-049497 A | 3/2012 |
| WO | WO 02093643 A1 | 11/2002 |

\* cited by examiner

COOLING DEVICE AND POWER CONVERTER HAVING COOLING DEVICE

CROSS-REFERENCE TO RELATED APPLICATIONS

This application is a continuation under 35 U.S.C. 120 of International Application PCT/JP2014/000922 having the International Filing Date of Feb. 21, 2014, and having the benefit of the earlier filing date of Japanese Application No. 2013-056929, filed Mar. 19, 2013. All of the identified applications are fully incorporated herein by reference.

TECHNICAL FIELD

The present invention relates to a cooling device that cools heat generating electronic components incorporated in a housing and a power converter having the cooling device.

BACKGROUND ART

A power converter such as an AC/DC converter includes a cooling device that cools down a plurality of electronic components including a heat generating electronic component, and an example of such a cooling device is disclosed in Patent Document 1, for example.

The cooling device of Patent Document 1 has an electronic component such as a substrate or a semiconductor device mounted on an upper surface of a planar heat sink and a plurality of plate-shaped cooling fins formed on a lower surface of the heat sink. Moreover, a chamber is connected to the heat sink, and cooling air is blown from a blower fan disposed in the chamber to a plurality of ventilation channels between the cooling fins.

A blast port of the blower fan is disposed to oppose a ventilation port that communicates with the plurality of ventilation channels of the heat sink, and the chamber has a larger projection area than a projection area having at least one of a projected shape of the blast port of the blower fan and a projected shape of the ventilation port of the heat sink in the opposing direction. Due to this, the device of Patent Document 1 allows a sufficient amount of cooling air flowing to the ventilation port of the heat sink to be secured with a blower fan having small capacity, whereby the heated semiconductor device mounted on the heat sink can be cooled down efficiently.

Patent Document 1: Japanese Patent Application Publication No. 2007-329253

DISCLOSURE OF THE INVENTION

However, although the device of Patent Document 1 has the cooling fins formed on the lower surface of the heat sink only, if the lower surface is extended to increase the number of cooling fins in order to increase the cooling ability of the heat sink, the device size may increase and the manufacturing cost may increase.

Moreover, although the amount of air blown by the blower fan may be increased in order to increase the cooling ability, the use of a blower fan having large capacity to blow a larger amount of air may increase power consumption and noise.

The present invention has been made in view of the problem, and an object thereof is to provide a small and inexpensive cooling device and a power converter having the same capable of reducing power consumption and noise of a coolant supply device.

In order to attain the object, an aspect of the present invention provides a ovice having a rectangular parallelepiped housing in which a plurality of electronic components including a heat generating electronic component is incorporated, this cooling device including: a plurality of heat-radiating side wall fins formed on an outer surface of a first side wall of the housing so as to extend in parallel in a longitudinal direction; a plurality of heat-radiating bottom fins formed on a bottom surface of a bottom portion of the housing so as to extend in parallel in the longitudinal direction; a cover member covering the plurality of side wall fins and the plurality of bottom fins from an outer side, and forming a side wall cooling channel between the plurality of side wall fins, and moreover forming a bottom cooling channel between the bottom fins; a chamber attached to a second side wall of the housing that faces in a direction of crossing the first side wall, and forming a fluid introduction chamber in a direction of facing the second side wall so that the side wall cooling channel and the bottom cooling channel communicate with the fluid introduction chamber; and a coolant supply device externally attached to the chamber so as to supply a coolant to the fluid introduction chamber, wherein the side wall fins and the bottom fins are formed in a predetermined shape, whereby an amount of the coolant flowing from the blower fan to the side wall cooling channel and the bottom cooling channel is adjusted.

According to the cooling device according to this aspect of the present invention, since fins (side wall fins and bottom fins) are formed on the bottom portion of the first side wall, it is possible to increase the cooling ability using a small housing.

In the cooling device according to an aspect of the present invention, at least one of a height and a pitch of adjacent fins of the side wall fins and the bottom fins is set to a different value from the other one, whereby the amount of the coolant supplied to the side wall cooling channel and the bottom cooling channel is adjusted.

According to the cooling device according to this aspect of the present invention, by setting at least one the fin height and a fin pitch of the side wall fins and the bottom fins to a different value from the other, it is possible to adjust the amount of the coolant supplied to the side wall cooling channel and the bottom cooling channel and to freely change the cooling ability of the first side wall and the bottom portion.

Moreover, in the cooling device according to an aspect of the present invention, the number of side wall fins extending in the longitudinal direction is different from the number of bottom fins extending in the longitudinal direction, whereby the amount of the coolant supplied to the side wall cooling channel and the bottom cooling channel is adjusted.

According to the cooling device according to this aspect of the present invention, since the number of side wall fins is different from the number of bottom fins, it is possible to adjust the amount of the coolant supplied to the side wall cooling channel and the bottom cooling channel and to freely change the cooling ability of the first side wall and the bottom portion.

In the cooling device according to an aspect of the present invention, the heating generating electronic component is disposed in contact with an inner surface of the first side wall inside the housing.

According to the cooling device according to this aspect of the present invention, since the heat generating electronic component is in contact with the inner surface of the first side wall in which the side wall cooling channel is formed, it is possible to cool down the heat generating electronic component efficiently.

Moreover, in the cooling device according to an aspect of the present invention, the heat generating electronic component is disposed in contact with an inner surface of the second side wall inside the housing.

According to the cooling device according to this aspect of the present invention, since the second side wall which forms the fluid introduction chamber and makes direct contact with a coolant is a cooling body, and the heat generating electronic component is in contact with the inner surface of the cooling body, it is possible to cool down the heat generating electronic component efficiently.

In the cooling device according to an aspect of the present invention, the coolant is air and the coolant supply device is one blower fan. According to the cooling device according to this aspect of the present invention, since cooling air can be supplied to the side wall cooling channel and the bottom cooling channel using one blower fan, it is possible to reduce the manufacturing cost and to reduce the power consumption and the noise of the blower fan.

In the cooling device according to an aspect of the present invention, the coolant is water and the coolant supply device is a pump. According to the cooling device according to this aspect of the present invention, it is possible to reduce the manufacturing cost.

Another aspect of the present invention provides a power converter which includes the cooling device having a rectangular parallelepiped housing in which a plurality of electronic components including a heat generating electronic component is incorporated, and which converts AC power into DC power, with this the power converter further including the cooling device.

According to the power converter according to this aspect of the present invention, it is possible to provide a small and inexpensive power converter capable of reducing the power consumption and the noise of the coolant supply device.

In the cooling device and the power converter having the same according to the present invention, since fins are formed on the first side wall and the bottom portion, it is possible to increase the cooling ability using a small housing and to supply cooling air to the side wall cooling channel and the bottom cooling channel using the coolant supply device. Therefore, it is possible to reduce the manufacturing cost and to reduce the power consumption and the noise of the coolant supply device.

BEST MODE FOR CARRYING OUT THE INVENTION

Hereinafter, a first embodiment of a power converter having a cooling device according to the present invention will be described with reference to FIGS. 1 to 7.

Figure 1:
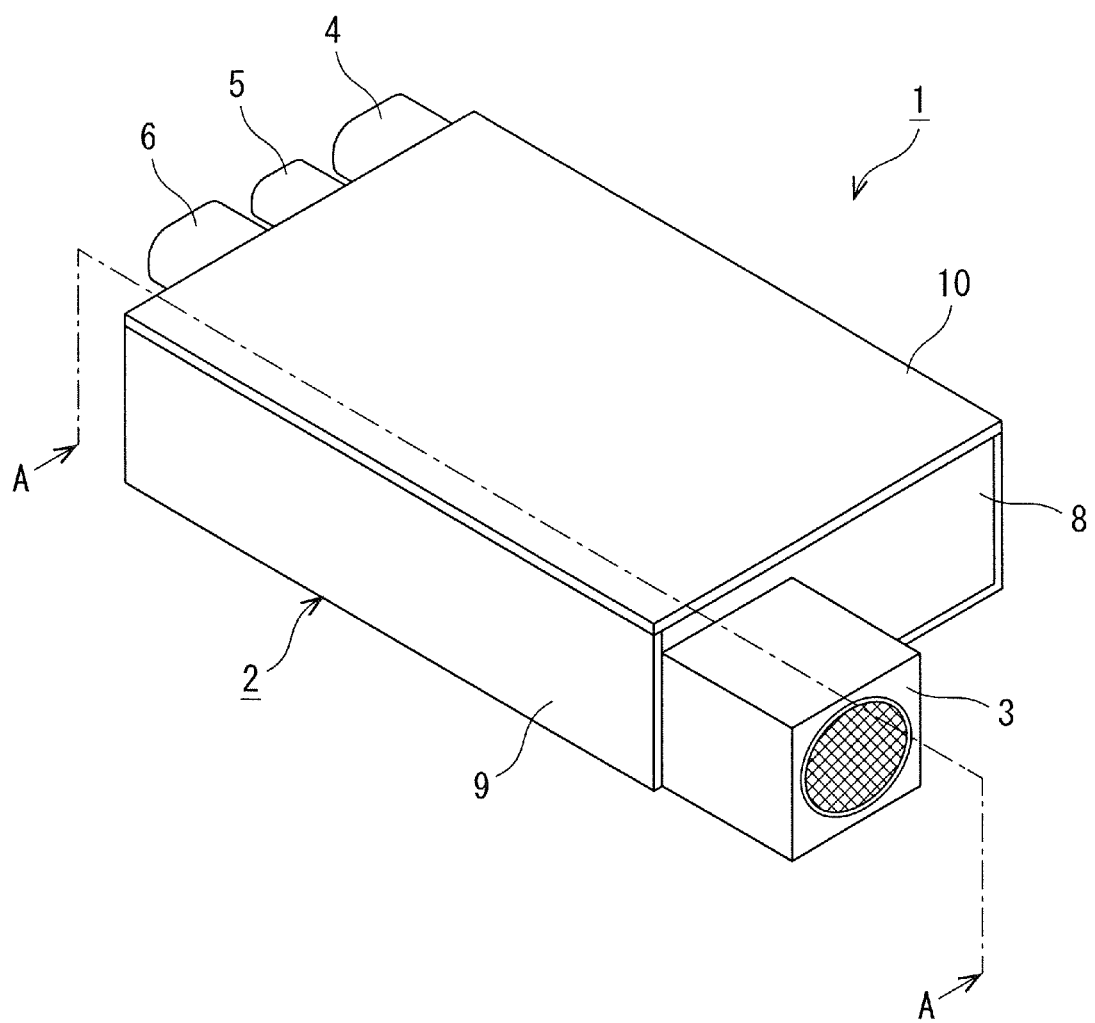
FIG. 1 is a perspective view illustrating an external view of an embodiment of a power converter having a cooling device according to a first embodiment of the present invention.
Figure 2:
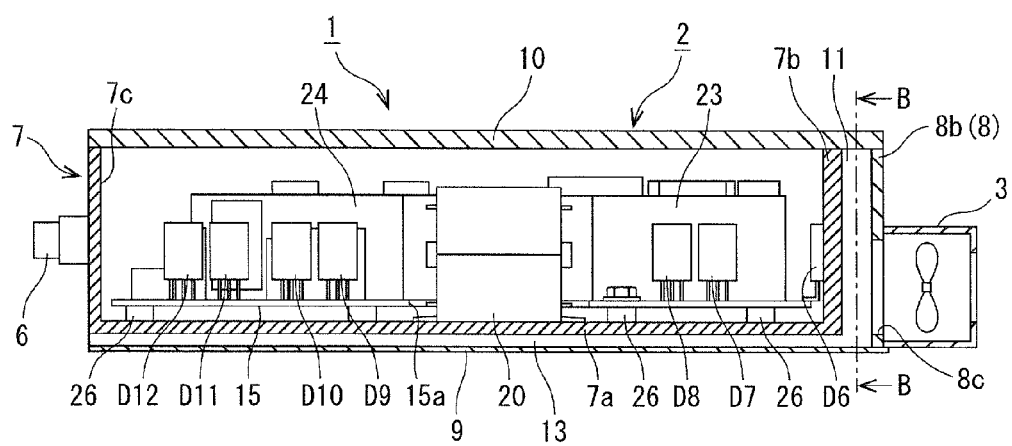
FIG. 2 is a cross-sectional view along line A-A of FIG. 1.

As illustrated in FIG. 1, a power converter 1 is a device used as an AC/DC converter and includes a rectangular parallelepiped housing 2. A blower fan 3 as a coolant supply device is externally attached to one side surface in a longitudinal direction of the housing 2. Moreover, an input connector 4, a control connector 5, and an output connector 6 are provided in parallel on the other side surface in the longitudinal direction of the housing 2. A power conversion control unit described later is incorporated in the housing 2. When a control signal is input to the control connector 5, commercial power input to the input connector 4 is converted from AC to DC by the power conversion control unit and is output as DC power from the output connector 6.

Specifically, the rectangular parallelepiped housing 2 includes a casing 7, a chamber forming wall 8, a housing cover 9, and a lid 10.

Figure 5:
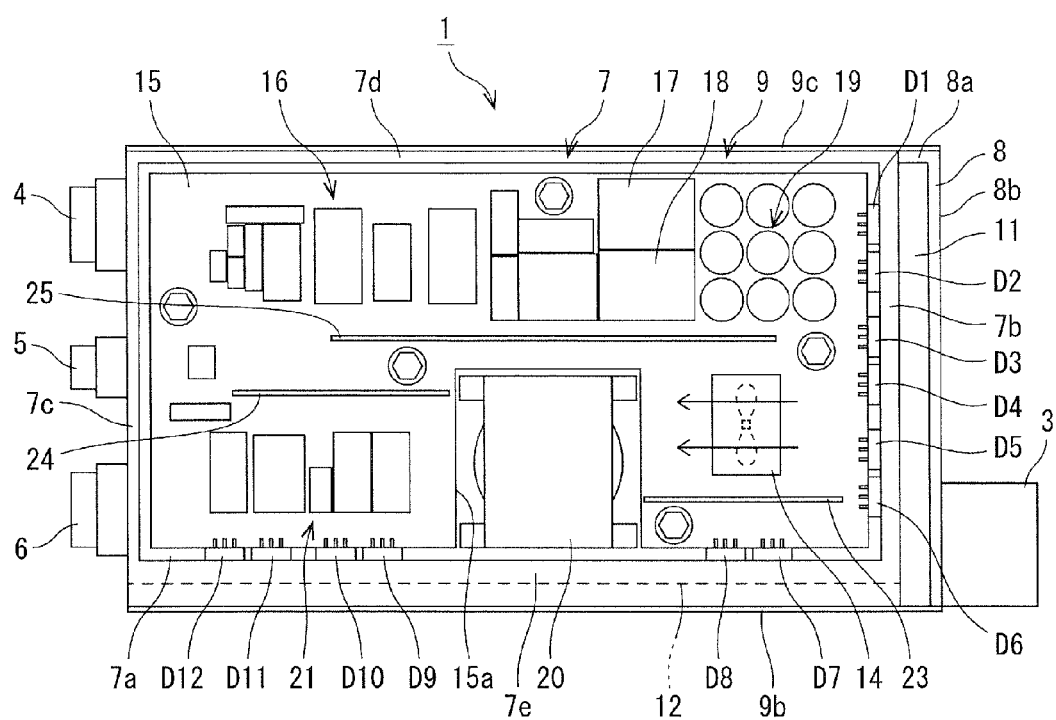
FIG. 5 is a plan view illustrating a state where a lid of a power converter according to a first embodiment of the present invention is removed to show the interior of the converter.

The casing 7 has a bottomed box shape, which is rectangular in a plan view, and as illustrated in FIG. 5, includes a rectangular bottom portion 7a and a pair of short-side side wall 7b and 7c and a pair of long-side side walls 7d and 7e erected from four sides of the bottom portion 7a. The casing 7 is formed by die-casting aluminum or an aluminum alloy having high heat conductivity, for example.

The chamber forming wall 8 is disposed on one side in the longitudinal direction of the casing 7 and includes a contacting wall 8a that makes contact with one short-side side wall 7b of the casing 7 and a facing wall 8b that faces the short-side side wall 7b of the casing 7.

The housing cover 9 is formed so as to cover a portion of the casing 7 and the chamber forming wall 8. The lid 10 is provided so as to block an upper opening of the casing 7 and the chamber forming wall 8 to seal the inside of the housing 2.

Figure 3:
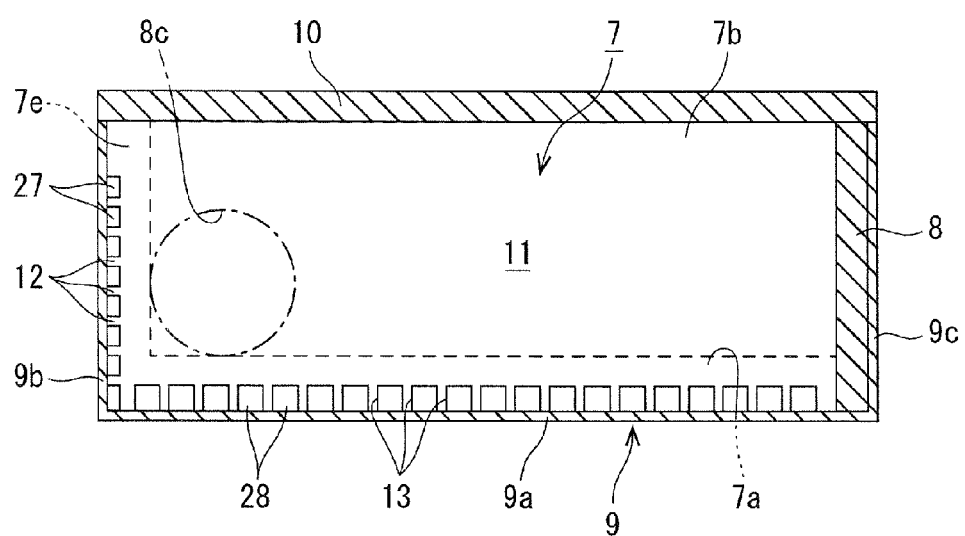
FIG. 3 is a cross-sectional view along line B-B of FIG. 2.
Figure 4:
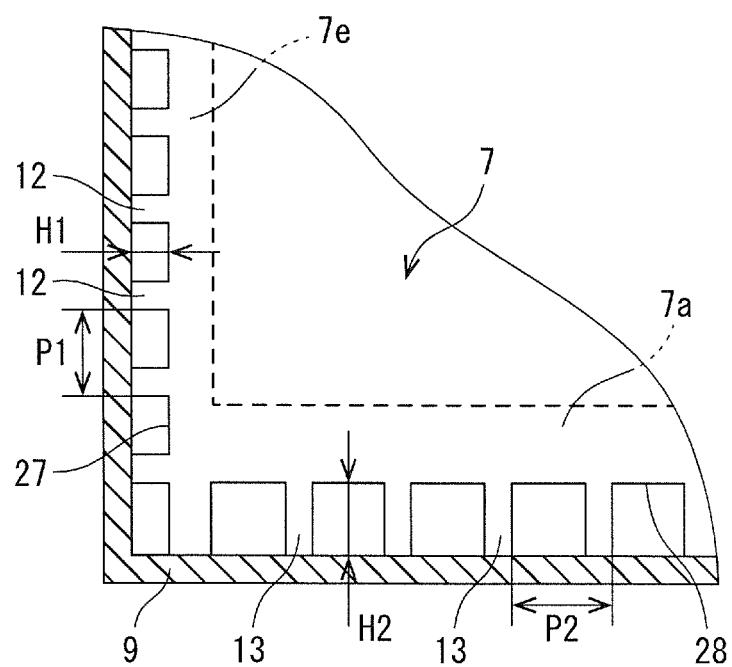
FIG. 4 is an enlarged view of a main part of FIG. 3.

Here, as illustrated in FIG. 3, a plurality of side wall fins 12 extending in the longitudinal direction is formed on a region on the outer side of one long-side side wall 7e of the casing 7, with these fins extending from a lower end to an upper portion on the outer side of one long-side side wall 7e. The plurality of side wall fins 12 is formed in parallel at predetermined intervals in a vertical direction of the long-side side wall 7e. As illustrated in FIG. 4, a fin height of each side wall fin 12 is set to H1 and the pitch of the side wall fins 12 is set to P1. As illustrated in FIG. 5, no side wall fin is formed on the outer side of the other long-side side wall 7d of the casing 7.

Moreover, as illustrated in FIG. 3, a plurality of bottom fins 13 extending in the longitudinal direction is also formed on a region of a lower surface of the bottom portion 7a of the casing 7, with these fins extending from a lower end to the right side of the lower surface of the bottom portion 7a. The plurality of bottom fins 13 is formed in parallel at predetermined intervals in a lateral direction of the bottom portion 7a. As illustrated in FIG. 4, a fin height of each bottom fin 13 is set to H2 (H2>H1), which is larger than the fin height H1 of the side wall fin 12. Further, the pitch of the bottom fins 13 is set to P2 (P2>P1), which is larger than the pitch P1 of the side wall fins 12.

The housing cover 9 is a cover member that covers the side wall fins 12 and the bottom fins 13 from the outer side. As illustrated in FIGS. 3 and 5, the housing cover 9 includes a rectangular bottom plate 9a that covers a lower opening of the chamber forming wall 8 and the bottom portion 7a of the casing 7 and a pair of side plates 9b and 9c that is erected from the edges of the bottom plate 9a so as to cover the lateral portions of the chamber forming wall 8 and the pair of long-side side walls 7d and 7e of the casing 7.

As illustrated in FIG. 3, the spaces between the plurality of side wall fins 12 and the spaces between the plurality of bottom fins 13 on the outer circumferences of the other long-side side wall 7e and the bottom portion 7a of the casing 7 covered with the housing cover 9 forma plurality of flow channels 27 and 28 extending in the longitudinal direction of the casing 7. Moreover, the lid 10 is fixed to the casing 7 and the chamber forming wall 8 so as to block the upper opening of the chamber forming wall 8 and the casing 7. In this manner, a space on the inner side surrounded by one short-side side wall 7b of the casing 7, the chamber forming wall 8, the housing cover 9, and the lid 10 is defined as a chamber 11 which is a fluid introduction chamber.

One set of ends in the longitudinal direction of the plurality of flow channels 27 and 28 formed between the housing cover 9 and the outer circumferences of the long-side side wall 7e and the bottom portion 7a of the casing 7 communicates with the chamber 11 and the other set of ends of the flow channels 27 and 28 communicates with the atmosphere. An opening 8c serving as an air inlet port is formed in the facing wall 8b of the chamber forming wall 8. The blower fan 3 is attached such that a ventilation port of the blower fan 3 faces the position of the opening 8c, and cool air generated by the blower fan 3 is blown into the chamber 11.

The power conversion control unit and an inner fan 14 are accommodated in the casing 7.

Figure 6:
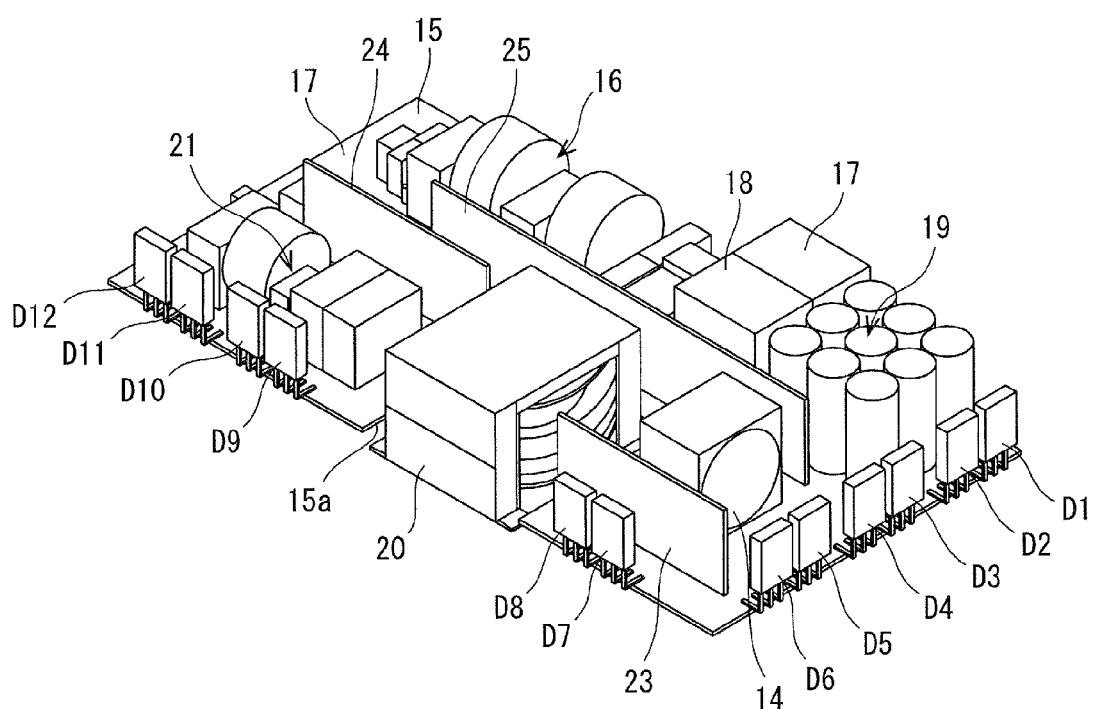
FIG. 6 is a perspective view illustrating control components according to the first embodiment of the present invention.

As illustrated in FIGS. 5 and 6, the power conversion control unit includes control components including a base substrate 15, an input-side noise filter unit 16, a first reactor 17, a second reactor 18, an electrolytic capacitor group 19, the transformer 20, an output-side noise filter unit 21, a plurality of semiconductor devices (for example, MOSFETs) D1 to D12, and first to third circuit boards 23 to 25.

The base substrate 15 is a member which has a rectangular shape that is smaller than a planar shape of the bottom portion 7a of the casing 7 and in which a notch 15a is formed on one long side. A predetermined wiring pattern (not illustrated) connected to the input connector 4, the control connector 5, and the output connector 6 is formed in the base substrate 15. The base substrate 15 is fixed by bolts to a support 26 formed on the upper surface of the bottom portion 7a of the casing 7 in a state where the notch 15a faces one long-side side wall 7e of the casing 7 (see FIG. 2).

The input-side noise filter unit 16, the first reactor 17, the second reactor 18, the electrolytic capacitor group 19, the output-side noise filter unit 21, the semiconductor device D1 to D12, and the first to third circuit boards 23 to 25 are mounted on the base substrate 15. The transformer 20 disposed on the inner side of the notch 15a of the base substrate 15 is fixed directly to the bottom portion 7a of the casing 7, and the inner fan 14 is disposed on the base substrate 15.

A specific layout of the control components and the inner fan 14 will be described with reference to FIG. 5.

The semiconductor devices D1 to D6 are mounted at predetermined intervals in parallel along one short side of the base substrate 15. The semiconductor devices D1 to D6 are positioned so that the semiconductor devices make direct contact with one short-side side wall 7b of the casing 7, defining the chamber 11. Other semiconductor devices D7 and D12 are mounted at predetermined intervals in parallel along one long side of the base substrate 15. The semiconductor devices D7 to D12 are positioned so that the semiconductor devices make direct contact with one long-side side wall 7e of the casing 7, forming the side wall fins 12.

Moreover, the third circuit board 25 is mounted at a central position in the lateral direction of the base substrate 15 so as to be erected while extending in the longitudinal direction. The second circuit board 24 is mounted on the base substrate 15 at a position close to the other short-side side wall 7c of the casing 7 so as to be erected in parallel to the third circuit board 25 while extending in the longitudinal direction.

Moreover, the input-side noise filter unit 16, the first reactor 17, the second reactor 18, and the electrolytic capacitor group 19 are mounted on the base substrate 15 so as to be positioned between the third circuit board 25 and the other long-side side wall 7d of the casing 7. Moreover, the output-side noise filter unit 21 is mounted on the base substrate 15 so as to be positioned between the second circuit board 24 and one long-side side wall 7e of the casing 7.

The inner fan 14 is disposed on the base substrate 15 at a position close to a position at which one long-side side wall 7e and one short-side side wall 7b of the casing 7 cross each other so that the direction of blowing cool air faces the other short-side side wall 7c of the casing 7.

The inner fan 14 is disposed on the base substrate 15 surrounded by the transformer 20, the third circuit board 25, and one short-side side wall 7b and one long-side side wall 7e of the casing 7. When air is blown from the inner fan 14, cooling air is blown in a direction (indicated by an arrow in FIG. 5) toward the transformer 20. Further, the first circuit board 23 is disposed between the inner fan 14 and one long-side side wall 7e of the casing 7 and is mounted on the base substrate 15 while having a function of guiding the cooling air generated by the inner fan 14 to the transformer 20.

A first side wall according to the present invention corresponds to one long-side side wall 7e. A second side wall according to the present invention corresponds to one short-side side wall 7b. A cover member according to the present invention corresponds to the housing cover 9. A side wall cooling channel according to the present invention corresponds to the flow channel 27. A bottom cooling channel according to the present invention corresponds to the flow channel 28. A heating generating electronic component disposed in contact with a second inner surface according to the present invention corresponds to the semiconductor devices D1 to D6. A heat generating electronic component disposed in contact with a first inner surface according to the present invention corresponds to the semiconductor devices D7 to D12. A coolant supply device according to the present invention corresponds to the blower fan.

Next, the operation and the cooling effect of the power converter 1 of the first embodiment will be described.

In the power converter 1 according to the present embodiment, when a control signal is input to the control connector 5, commercial power input to the input connector 4 is converted from AC to DC by the power conversion control unit accommodated in the casing 7 and is output as DC power from the output connector 6. In this case, the control components such as the transformer 20 and the power conversion control unit in the casing 7 generate heat, and in particular, the semiconductor devices D1 to D12, the transformer 20, the first reactor, the second reactor, and the electrolytic capacitor group 19 generate a large amount of heat.

In the power converter 1, when the blower fan 3 is driven, the cooling air drawn from the outside is blown into the chamber 11. The cooling air blown into the chamber 11 enters into the plurality of flow channels 28 formed on the bottom portion 7a of the casing 7 communicating with the chamber 11 and also into the plurality of flow channels 27 formed on one long-side side wall 7e and is discharged outside by flowing toward the other end (the other short-side side wall 7c) in the longitudinal direction along the plurality of side wall fins 12 and the plurality of bottom fins 13.

Here, when the cooling air is blown from the blower fan 3 to the chamber 11, since the area of an outer wall of one short-side side wall 7b of the casing 7 with which the cooling air makes contact increases, the short-side side wall 7b serves as a cooling body. Moreover, when the cooling air of the chamber 11 flows into the plurality of flow channels 28 formed on the bottom portion 7a, since the area of portions of the plurality of bottom fins 13 with which the cooling air makes contact increases, the bottom portion 7a also serves as a cooling body. Further, when the cooling air of the chamber 11 flows into the plurality of flow channels 27 formed on one long-side side wall 7e, since the area of portions of the plurality of side wall fins 12 with which the cooling air makes contact increases, the long-side side wall 7e also serves as a cooling body.

In the present embodiment, the fin height H2 of the bottom fin 13 is larger than the fin height H1 of the side wall fin 12 and the pitch P2 of the neighboring bottom fins 13 is larger than the pitch P1 of the neighboring side wall fins 12. Thus, the amount of the cooling air blown from the blower fan 3 increases since the pressure loss in the plurality of flow channels 28 formed by the bottom fins 13 decreases as compared to the pressure loss in the flow channels 27 formed by the side wall fins 12. Due to this, the cooling efficiency of the bottom portion 7a is enhanced as compared to one long-side side wall 7e.

Since the semiconductor devices D1 to D6 are indirect contact with the inner surface of one short-side side wall 7b of the casing 7 serving as a cooling body, the heat generated by the semiconductor devices D1 to D6 is efficiently radiated to one short-side side wall 7b and is cooled reliably.

Moreover, since the semiconductor devices D7 to D12 are in direct contact with one long-side side wall 7e of the casing 7 serving as a cooling body, the heat generated by the semiconductor devices D7 to D12 is efficiently radiated to one long-side side wall 7e and is cooled reliably.

Moreover, since the transformer 20 is fixed directly to the bottom portion 7a of the casing 7 serving as a cooling body, the heat generated by the transformer 20 is efficiently radiated to the bottom portion 7a and is cooled reliably.

Figure 7:
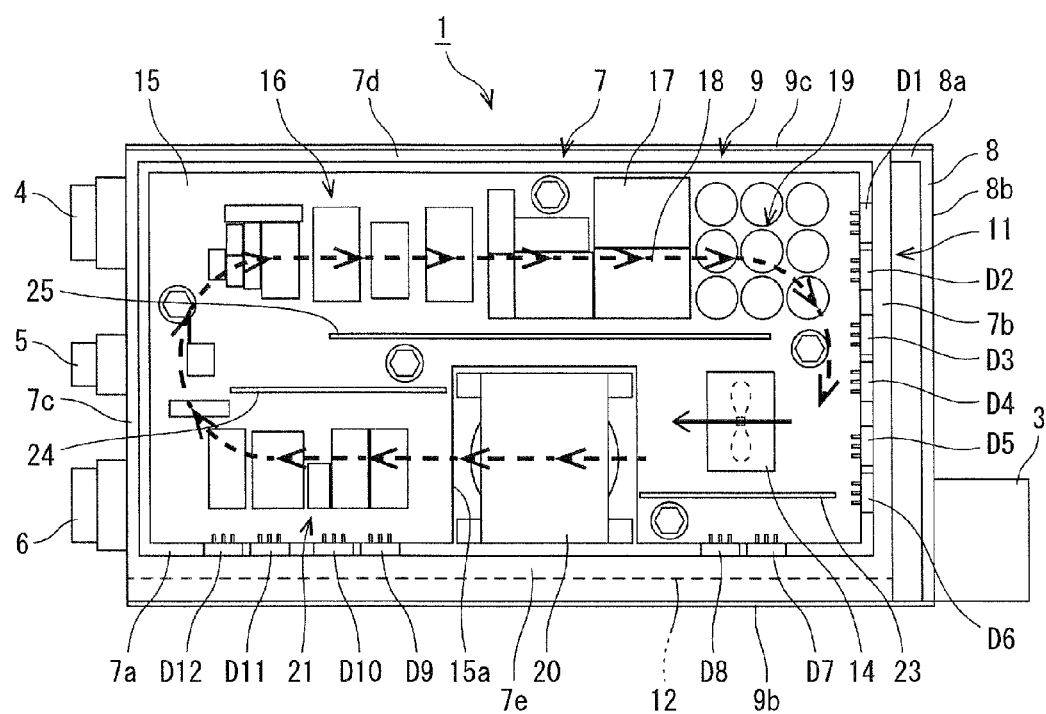
FIG. 7 is a diagram illustrating the flow of cool air in the casing, generated with driving of an inner fan.

When the inner fan 14 disposed on the base substrate 15 is driven, the third circuit board 25 and the second circuit board 24 erected and mounted at the central position in the lateral direction of the base substrate 15 function as a wind guiding plate, and a flow of cool air which circulate in the order of the transformer 20, the output-side noise filter unit 21, the input-side noise filter unit 16, the first reactor, the second reactor, and the electrolytic capacitor group 19 is generated as indicated by a broken-line arrow in FIG. 7. The cooling air circulating inside the casing 7 is radiated by coming in contact with one short-side side wall 7b and one long-side side wall 7e of the cooling body 7 and the bottom portion 7a of the casing 7, which are cooling bodies, when the cooling air circulates around the first reactor, the second reactor, and the electrolytic capacitor group 19, the cooling effect is enhanced.

Next, advantageous effects of the first embodiment will be described.

In the present embodiment, the plurality of side wall fins 12 extending in parallel in the longitudinal direction is formed on the outer surface of one long-side side wall 7e of the casing 7, and the plurality of bottom fins 13 extending in parallel in the longitudinal direction is formed on the bottom surface of the bottom portion 7a. Therefore, since the number of fins making contact with cooling air can be increased without increasing the area of the bottom portion 7a, it is possible to increase the cooling ability with a small device (the housing 2) as compared to the conventional cooling device.

Moreover, since one blower fan 3 is used for supplying cooling air to the flow channel 27 formed between the plurality of side wall fins 12 and the flow channel 28 formed between the plurality of bottom fins 13, it is possible to reduce the number of device components and to reduce the cost of manufacture.

Further, by forming the side wall fin 12 and the bottom fin 13 in a predetermined fin shape, it is possible to adjust the amount of cooling air supplied to the flow channel 27 and the flow channel 28 and to freely change the cooling ability of one long-side side wall 7e and the bottom portion 7a.

Further, since the amount of cooling air supplied to the flow channels 27 and 28 can be adjusted without increasing the capacity of the blower fan 3, it is possible to reduce the power consumption and the noise of the blower fan 3.

Further, since the semiconductor devices D7 to D12 are in direct contact with the inner surface of one long-side side wall 7e which is a cooling body, the heat generated by the semiconductor devices D7 to D12 is efficiently radiated to one long-side side wall 7e and the semiconductor devices D7 to D12 can be cooled down reliably.

Further, since the semiconductor devices D1 to D6 are in direct contact with one short-side side wall 7b of the casing 7, which is a cooling body, heat generated by the semiconductor devices D1 to D6 is efficiently radiated to one short-side side wall 7b and the semiconductor devices D1 to D6 can be cooled down reliably.

In the present embodiment, the fin height H2 of the bottom fin 13 is larger than the fin height H1 of the side wall fin 12 and the pitch P2 of the neighboring bottom fins 13 is larger than the pitch P1 of the neighboring side wall fins 12 so that the cooling efficiency of the bottom portion 7a is enhanced as compared to the long-side side wall 7e. However, the present invention is not limited to this, and one of the fin height and the fin pitch may be constant and the other may be changed so that the cooling efficiency of the bottom portion 7a is enhanced as compared to one long-side side wall 7e. Moreover, by forming the fins in a predetermined fin shape, the cooling efficiency of one long-side side wall 7e may be enhanced as compared to the bottom portion 7a.

Further, by forming the bottom fin 13 and the side wall fin 12 in the same fin shape and changing the number of fins, the cooling ability of the bottom portion 7a and one long-side side wall 7e may be changed.

Here, in the first embodiment, although an example in which air is used as a coolant and the blower fan 3 is provided as the coolant supply device has been described, the present invention is not limited to this, and a power converter may include a cooling device according to the second embodiment illustrated in FIGS. 8 to 12.

The power converter of the second embodiment illustrated in FIGS. 8 to 12 uses water as a coolant and includes a pump as a coolant supply device. The same constituent portions as those in the first embodiment illustrated in FIGS. 1 to 7 will be denoted by the same reference numerals and description thereof will not be provided.

Figure 8:
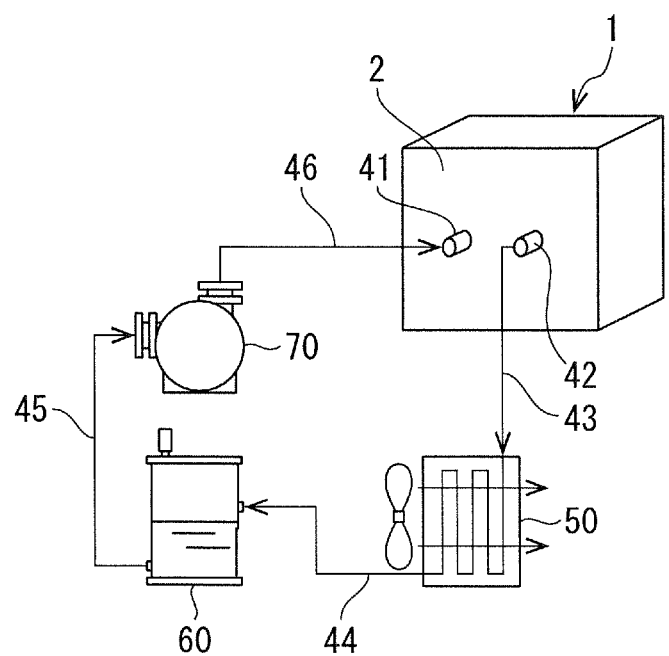
FIG. 8 is a diagram illustrating a system configuration of a power converter having a cooling device according to a second embodiment of the present invention.

As illustrated in FIG. 8, a power converter 1 according to the second embodiment is used for charging a battery mounted in an electric vehicle, a hybrid vehicle, or the like, for example, and includes a heat exchanger 50, a reservoir tank 60, and a pump 70 in order to circulate cooling water.

In the power converter 1, a cooling water supply port 41 and a cooling water drain port 42 are externally attached to the housing 2.

The cooling water drain port 42 is connected to the heat exchanger 50 by the drain pipe 43. The heat exchanger 50 may be an air-cooled radiator or the like mounted in a vehicle. The cooling water supply port 41 is connected to the pump 70 by a supply pipe 46.

The reservoir tank 60 storing cooling water is provided between the heat exchanger 50 and the pump 70, and the reservoir tank 60 is connected between the heat exchanger 50 and the pump 70 by pipes 44 and 45.

In the present embodiment, when the cooling water stored in the reservoir tank 60 is pressurized by the pump 70, the cooling water is supplied from the cooling water supply port 41 to the power converter 1. Moreover, the cooling water heated inside the power converter 1 is discharged from the cooling water drain port 42 and is introduced to the heat exchanger 50. The heated cooling water cools down the inside of the power converter 1 by a cycle that the cooling water is cooled by heat-exchanging with the cooling air by the heat exchanger 50 and is stored in the reservoir tank 60 again.

Since the power converter 1 of the present embodiment uses water (cooling water) as a coolant, a space (hereinafter referred to as a cooling chamber) surrounding the space defining the chamber 11 and the bottom fins 13 and the side wall fins 12 communicating with the chamber 11 are liquid-sealed reliably and leakage of the cooling water from the cooling chamber and the chamber 11 is prevented.

That is, as illustrated in FIGS. 9 to 12, the housing cover 9 of the present embodiment and the portion corresponding to the chamber forming wall 8 are formed integrally. The housing cover 9 and the chamber forming wall 8 are integrally formed by die-casting aluminum or an aluminum alloy having high heat conductivity, for example. However, the housing cover 9 and the chamber forming wall 8 may be formed as separate structures as long as these components are reliably liquid-sealed by a packing or the like.

Figure 10:
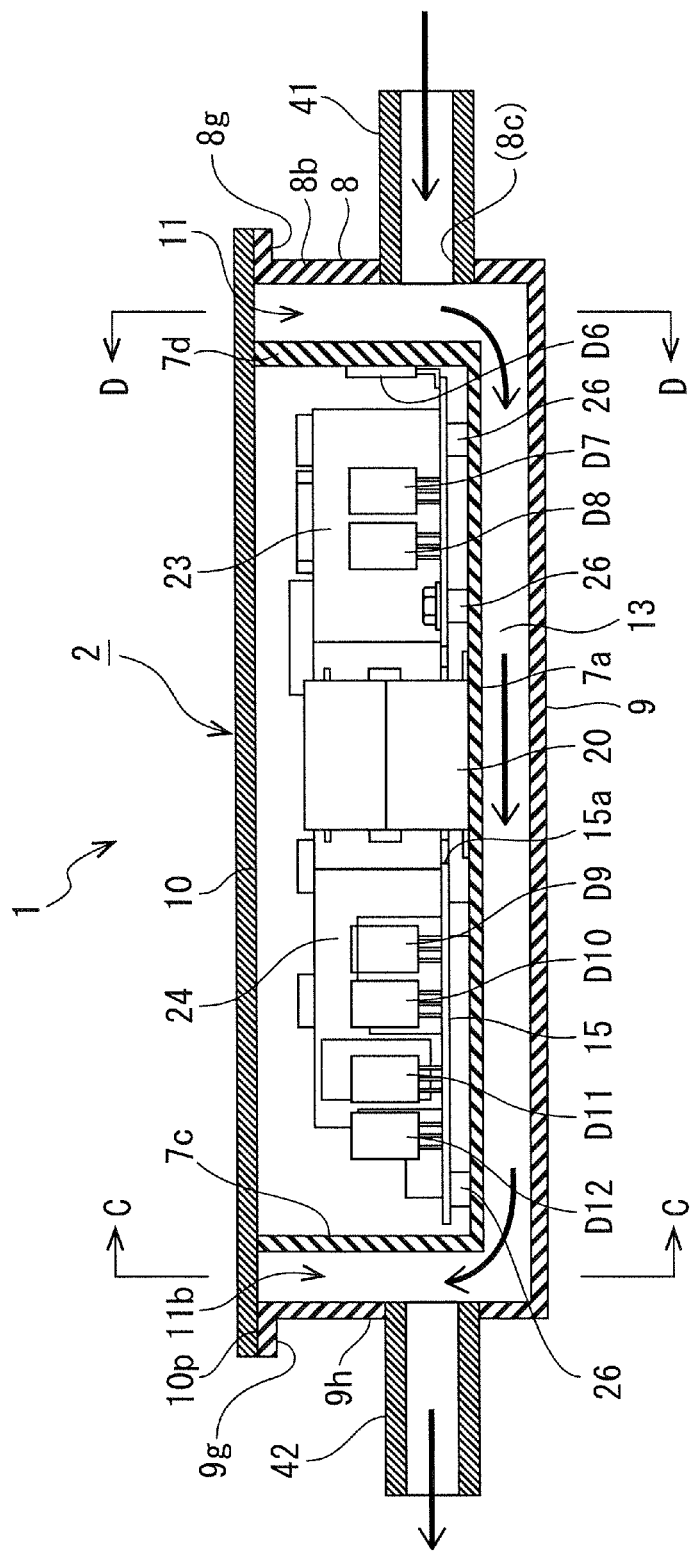
FIG. 10 is a cross-sectional view of the power converter according to the second embodiment of the present invention.

Although the lid 10 that covers the upper portion of the housing 2 can be detached, a packing is interposed between mutual bonding surfaces of the rear surface of the lid 10 and the upper end surfaces of the housing cover 9 and the chamber forming wall 8. That is, as illustrated in FIG. 10, flanges 8g and 9g are formed on the upper ends of the housing cover 9 and the chamber forming wall 8. A liquid packing 10p is coated on the upper surfaces of the flanges 8g and 9g and the upper end surfaces of the housing cover 9 and the chamber forming wall 8 so as to surround the upper opening, and the lid 10 is fixed to the flanges 8g and 9g by a fixing member such as a screw. In this way, the upper opening of the chamber 11 and the cooling chamber is liquid-sealed and leakage of the cooling water from the rear surface portion of the lid 10 is prevented.

Figure 11:
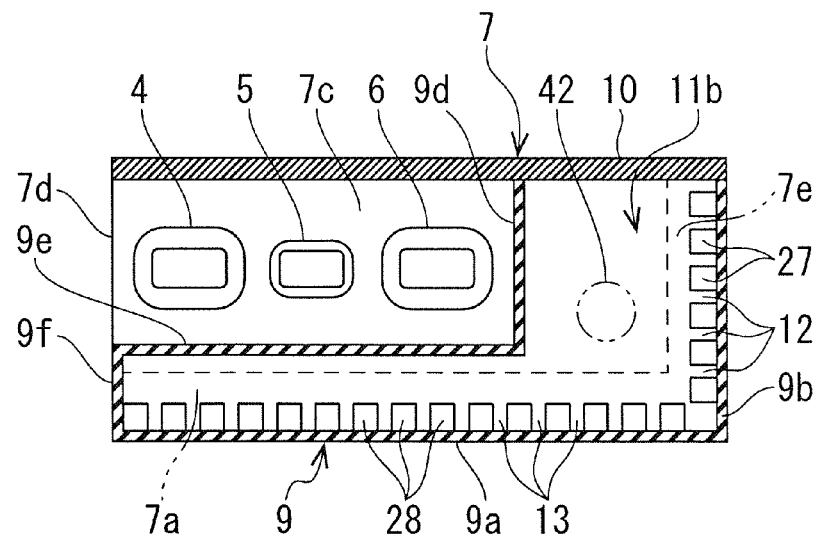
FIG. 11 is a cross-sectional view along line C-C of FIG. 10.

Moreover, in the present embodiment, as illustrated in FIG. 11, the layout of the connectors 4, 5, and 6 is shifter further toward the long-side side wall 7d and a second chamber 11b having an approximately L shape (the space formed by partition walls 9d, 9e, and 9f, the bottom plate 9a, and the side plate 9b illustrated in FIG. 11, the second facing wall 9h facing the short-side side wall 7c illustrated in FIG. 10, and the lid 10) is provided in a portion close to the long-side side wall 7e facing the short-side side wall 7c. In this way, the second chamber 11b has a sealed structure.

Figure 9:
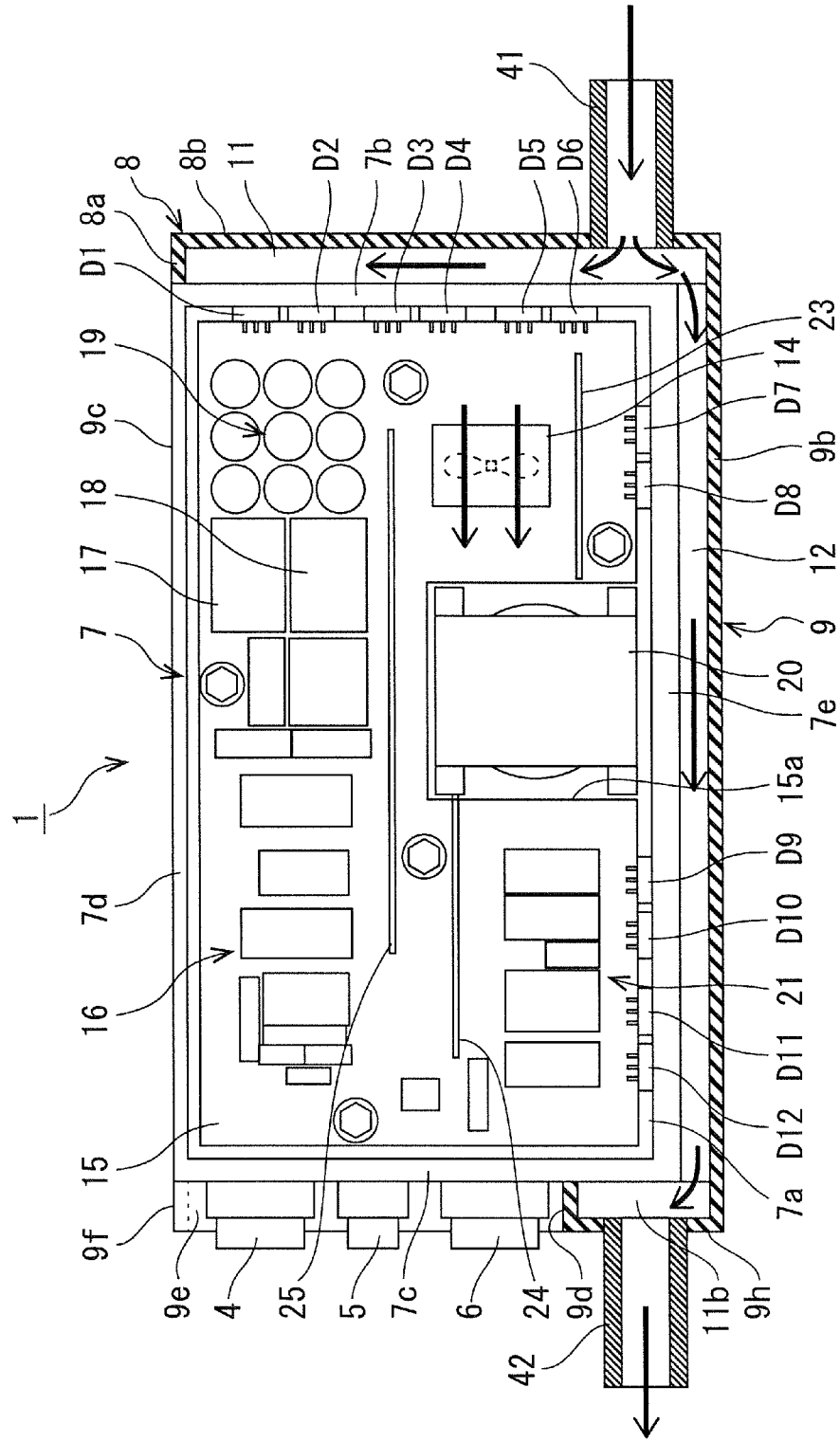
FIG. 9 is a plan view illustrating a state where a lid of the power converter according to a second embodiment of the present invention is removed to show the interior of the converter.

The cooling water supply port 41 connected to the pump 70 by the supply pipe 46 is formed in the facing wall 8b so as to communicate with the chamber 11 as illustrated in FIGS. 9 and 10. Moreover, the cooling water drain port 42 connected to the heat exchanger 50 by the drain pipe 43 is formed in the second facing wall 9h so as to communicate with the second chamber 11b as illustrated in FIGS. 9 and 10.

Here, in the present embodiment, similarly to the first embodiment, the plurality of side wall fins 12 extending in the longitudinal direction is formed in a region on the outer side of one long-side side wall 7e of the casing 7, with these plurality of side wall fins 12 extending from a lower end to an upper portion on the one long-side side wall 7e. The plurality of bottom fins 13 extending in the longitudinal direction is formed in a region extending from a left end to the right side of the lower surface of the bottom portion 7a of the casing 7.

Figure 12:
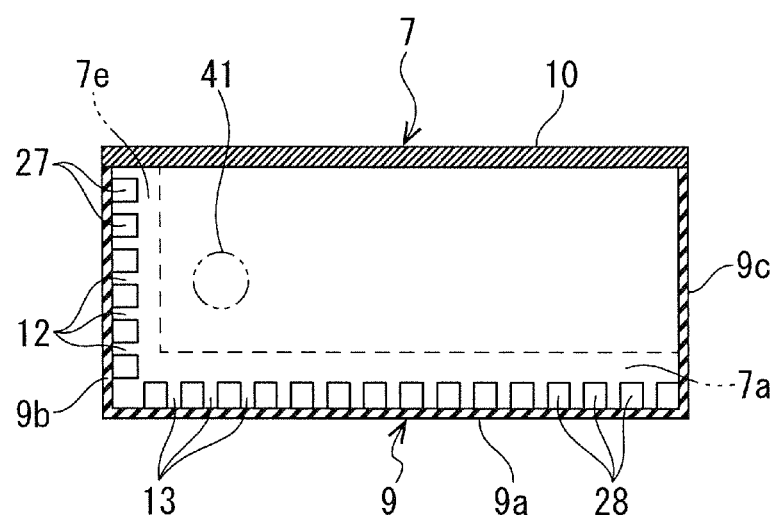
FIG. 12 is a cross-sectional view along line D-D of FIG. 10.

That is, as illustrated in FIGS. 11 and 12, the plurality of side wall fins 12 is formed in parallel at predetermined intervals in the vertical direction of the long-side side wall 7e. In the present embodiment, as illustrated in FIG. 4, the fin height of each side wall fin 12 is set to H1 and the pitch of the side wall fins 12 is set to P1.

Moreover, the plurality of bottom fins 13 is formed in parallel at predetermined intervals in the lateral direction of the bottom portion 7a. In the present embodiment, as illustrated in FIG. 4, the fin height of each bottom fin 13 is set to H2 (H2>H1), which is larger than the fin height H1 of the side wall fin 12. Further, the pitch of the bottom fins 13 is set to P2 (P2>P1), which is larger than the pitch P1 of the side wall fins 12.

The coolant supply device according to the present invention corresponds to the pump 70.

In the power converter 1 of the present embodiment, cooling water introduced from the pump 70 into the chamber 11 via the cooling water supply port 41 enters into the plurality of flow channels 28 formed on the bottom portion 7a of the casing 7 communicating the chamber 11 and also into the plurality of flow channels 27 formed on one long-side side wall 7e, flows to a second chamber on the other end side in the longitudinal direction along the plurality of side wall fins 12 and the plurality of bottom fins 13 and is delivered to the heat exchanger 50 via the cooling water drain port 42.

Here, when the cooling water is introduced into the chamber 11, since the area of a portion of the outer wall of one short-side side wall 7b of the casing 7, with which the cooling water makes contact, increases, the short-side side wall 7b serves as a cooling body. Moreover, when the cooling water of the chamber 11 flows into the plurality of flow channels 28 formed on the bottom portion 7a, since the area of a portion of the plurality of bottom fins 13, with which the cooling water makes contact, increases, the bottom portion 7a also serves as a cooling body. Further, when the cooling water of the chamber 11 flows into the plurality of flow channels 27 formed on one long-side side wall 7e, the area of a portion of the plurality of side wall fins 12, with which the cooling water makes contact, increases, the long-side side wall 7e also serves as a cooling body.

In the present embodiment, the fin height H2 of the bottom fin 13 is larger than the fin height H1 of the side wall fin 12, and the pitch P2 of neighboring fins of the bottom fins 13 is larger than the pitch P1 of neighboring fins of the side wall fins 12. Therefore, the amount of cooling water supplied from the pump 70 increases since the pressure loss in the plurality of flow channels 28 formed by the bottom fins 13 decreases as compared to the pressure loss in the flow channels 27 formed by the side wall fins 12. Due to this, the cooling efficiency of the bottom portion 7a is enhanced as compared to one long-side side wall 7e.

Since the semiconductor devices D1 to D6 are indirect contact with the inner surface of one short-side side wall 7b of the casing 7, which serves as a cooling body, the heat generated by the semiconductor devices D1 to D6 is efficiently radiated to one short-side side wall 7b and is reliably cooled down.

Moreover, since the semiconductor devices D7 to D12 are in direct contact with one long-side side wall 7e of the casing 7, which serves as a cooling body, the heat generated by the semiconductor devices D7 to D12 is efficiently radiated to one long-side side wall 7e and is reliably cooled down.

Moreover, since the transformer 20 is fixed so as to make direct contact with the bottom portion 7a of the casing 7, which serves as a cooling body, the heat generated by the transformer 20 is efficiently radiated to the bottom portion 7a and is reliably cooled down.

Next, advantageous effects of the second embodiment will be described.

In the present embodiment, the plurality of side wall fins 12 extending in parallel in the longitudinal direction is formed on the outer surface of one long-side side wall 7e of the casing 7, and the plurality of bottom fins 13 extending in parallel in the longitudinal direction is formed on the bottom surface of the bottom portion 7a. Therefore, since the number of fins making contact with cooling air can be increased without increasing the area of the bottom portion 7a, it is possible to increase the cooling ability with a small device (the housing 2) as compared to the conventional cooling device.

Further, by forming the side wall fin 12 and the bottom fin 13 in a predetermined fin shape, it is possible to adjust the amount of cooling water supplied to the flow channel 27 and the flow channel 28 and to freely change the cooling ability of one long-side side wall 7e and the bottom portion 7a.

Further, since the amount of cooling water supplied to the flow channels 27 and 28 can be adjusted without increasing the discharging ability of the pump 70, it is possible to reduce the power consumption and the noise of the pump 70.

INDUSTRIAL APPLICABILITY

As described above, the cooling device and the power converter having the same according to the present invention are useful for reducing power consumption and noise of a coolant supply device with a small device.

EXPLANATION OF REFERENCE NUMERALS

1: Power converter
2: Housing
3: Blower fan
4: Input connector
5: Control connector
6: Output connector
7: Casing
7a: Bottom portion
7b: Short-side side wall
7c: Short-side side wall
7d: Long-side side wall
7e: Long-side side wall
8: Chamber forming wall
8a: Contacting wall
8b: Facing wall
8c: Opening
8g, 9g: Flange
9: Housing cover
9a: Bottom plate
9b, 9c: Side plate
9d, 9e, 9f: Partition wall
9h: Second facing wall
10: Lid
10p: Liquid packing
11: Chamber
11b: Second chamber
12: Side wall fin
13: Bottom fin
14: Inner fan
15: Base substrate
15a: Notch
16: Input-side noise filter unit
17: First reactor
18: Second reactor
19: Electrolytic capacitor group
20: Transformer
21: Output-side noise filter unit
23: First circuit board
24: Second circuit board
25: Third circuit board
26: Support
27, 28: Flow channel
41: Cooling water supply port
42: Cooling water drain port
43: Drain pipe
44, 45: Pipe
50: Heat exchanger
60: Reservoir tank
70: Pump
D1 to D12: Semiconductor device

The invention claimed is:

1. A cooling device, comprising:
a rectangular parallelepiped housing having a longitudinal axis and in which a plurality of electronic components, including a heat generating electronic component, is housed, the plurality of electronic components being arranged along a longitudinal direction of the housing to have a first end of the electronic components arranged opposite a second end of the electronic components along the longitudinal direction;
a plurality of heat-radiating side wall fins formed on an outer surface of a first side wall of the housing so as to each have a side longitudinal axis that extends in parallel with the longitudinal axis of the housing, at least one of the side wall fins extending along the side longitudinal axis thereof from the first end of the electronic components to the second end of the electronic components;
a plurality of heat-radiating bottom fins formed on a bottom surface of a bottom portion of the housing so as to each have a bottom longitudinal axis that extends in parallel with the longitudinal axis of the housing, at least one of the bottom fins extending along the bottom longitudinal axis thereof from the first end to the second end;
a cover member covering the plurality of heat-radiating side wall fins and the plurality of heat-radiating bottom fins from an outer side, the cover member forming a side wall cooling channel between the plurality of heat-radiating side wall fins, and further forming a bottom cooling channel between the bottom fins;
a fluid introduction chamber attached to a second side wall of the housing, the fluid introduction chamber facing in a direction crossing the first side wall, and in a direction to face the second side wall so that the side wall cooling channel and the bottom cooling channel communicate with the fluid introduction chamber; and
a coolant supply device externally attached to the chamber and supplying a coolant to the side wall and bottom cooling channels via the fluid introduction chamber,
wherein the side wall fins and the bottom fins are formed in predetermined shapes, whereby an amount of the coolant supplied from the coolant supply device to the side wall cooling channel is adjusted and an amount of the coolant supplied from the coolant supply device to the bottom cooling channel is adjusted.

2. The cooling device according to claim 1, wherein
the side wall fins have a side wall fin height, and a side wall fin pitch between adjacent fins of the side wall fins,
the bottom fins have a bottom fin height, and a bottom fin pitch between adjacent fins of the bottom fins,
at least one of
the side wall fin height is different from the bottom fin height, whereby the amount of the coolant supplied to the side wall cooling channel is adjusted and the amount of the coolant supplied to the bottom cooling channel is adjusted, and
the side wall fin pitch is different from the bottom fin pitch, whereby the amount of the coolant supplied to the side wall cooling channel is adjusted and the amount of the coolant supplied to the bottom cooling channel is adjusted.

3. The cooling device according to claim 1, wherein a total number of the side wall fins is different from a total number of the bottom fins, whereby the amount of the coolant supplied to the side wall cooling channel is adjusted and the amount of the coolant supplied to the bottom cooling channel is adjusted.

4. The cooling device according to claim 1, wherein the heat generating electronic component is disposed inside the housing to be in contact with an inner surface of the first side wall.

5. The cooling device according to claim 1, wherein the heat generating electronic component is disposed inside the housing to be in contact with an inner surface of the second side wall.

6. The cooling device according to claim 1, wherein the coolant is air, and the coolant supply device is a blower fan.

7. The cooling device according to claim 1, wherein the coolant is water, and the coolant supply device is a pump.

8. A power converter comprising the cooling device according to claim 1, wherein the power converter converts AC power into DC power.

9. The cooling device according to claim 1, wherein
the side wall fins have a side wall fin height, and a side wall fin pitch between adjacent fins of the side wall fins,
the bottom fins have a bottom fin height, and a bottom fin pitch between adjacent fins of the bottom fins,
the side wall fins and the bottom fins have different sizes from each other to include at least one selected from the following group consisting of
the side wall fin height is different from the bottom fin height, whereby the amount of the coolant supplied to the side wall cooling channel is adjusted and the amount of the coolant supplied to the bottom cooling channel is adjusted, and
the side wall fin pitch is different from the bottom fin pitch, whereby the amount of the coolant supplied to the side wall cooling channel is adjusted and the amount of the coolant supplied to the bottom cooling channel is adjusted.

10. The cooling device according to claim 1, wherein a fin height of the bottom fins is larger than a fin height of the side wall fins so that an amount of the coolant flowing along the bottom portion is greater than an amount of the coolant flowing along the first side wall.

11. The cooling device according to claim 1, wherein a pitch of the bottom fins is larger than a pitch of the side wall fins so that an amount of the coolant flowing along the bottom portion is greater than an amount of the coolant flowing along the first side wall.

12. A cooling device, comprising:
a housing having a longitudinal axis and that houses a heat generating electronic component, the heat generating electronic component being arranged along a longitudinal direction of the housing to have a first end thereof arranged opposite a second end thereof along the longitudinal direction;
a plurality of heat-radiating first wall fins formed on one wall of the housing so as to each have a first longitudinal axis that extends in parallel with the longitudinal axis of the housing, at least one of the first wall fins extending along the first longitudinal axis thereof from the first end to the second end;
a plurality of heat-radiating second wall fins formed on another wall of the housing so as to each have another longitudinal axis that extends in parallel with the longitudinal axis of the housing, at least one of the second wall fins extending along the another longitudinal axis thereof from the first end to the second end;
a cover member covering the first and second wall fins, the cover member forming a first cooling channel between the first wall fins, and further forming a second cooling channel between the second wall fins;
a fluid introduction chamber attached to a side wall of the housing, and that is in communication with the first and second cooling channels; and
a coolant supply device attached to the chamber so as to supply a coolant to the first and second cooling channels via the fluid introduction chamber,
wherein the first and second fins are formed in predetermined shapes to adjust an amount of the coolant in the first cooling channel and an amount of the coolant in the second cooling channel.

13. The cooling device according to claim 12, wherein the cover member forms an outermost cover of the housing,
- the first wall fins being in direct contact with a first inner surface of the cover member, and
- the second wall fins being in direct contact with a second inner surface of the cover member.

14. The cooling device according to claim 1, wherein the cover member forms an outermost cover of the housing,
- the side wall fins being in direct contact with a first inner surface of the cover member, and
- the bottom fins being in direct contact with a second inner surface of the cover member.

\* \* \* \* \*